United States Patent
Eum et al.

(10) Patent No.: US 12,428,730 B2
(45) Date of Patent: Sep. 30, 2025

(54) APPARATUS FOR TREATING SUBSTRATE

(71) Applicant: SEMES CO., LTD., Cheonan-si (KR)

(72) Inventors: Ki Sang Eum, Cheonan-si (KR); Woo Ram Lee, Seoul (KR); Jong Wha Kang, Cheonan-si (KR); Dong Woon Park, Seoul (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 385 days.

(21) Appl. No.: 17/837,241

(22) Filed: Jun. 10, 2022

(65) Prior Publication Data
US 2022/0403517 A1  Dec. 22, 2022

(30) Foreign Application Priority Data

Jun. 11, 2021 (KR) .................. 10-2021-0076031

(51) Int. Cl.
| | |
|---|---|
| C23C 16/455 | (2006.01) |
| C23C 16/44 | (2006.01) |
| C23C 16/458 | (2006.01) |
| C23C 16/46 | (2006.01) |

(52) U.S. Cl.
CPC .... C23C 16/45563 (2013.01); C23C 16/4412 (2013.01); C23C 16/4586 (2013.01); C23C 16/46 (2013.01)

(58) Field of Classification Search
CPC .......... C23C 16/45563; C23C 16/4412; C23C 16/4586; C23C 16/46
See application file for complete search history.

(56) References Cited

U.S. PATENT DOCUMENTS

| | | | |
|---|---|---|---|
| 2006/0137608 A1* | 6/2006 | Choi | C23C 16/45512 118/715 |
| 2007/0026147 A1* | 2/2007 | Chen | C23C 16/45512 427/532 |
| 2017/0009347 A1* | 1/2017 | Jang | C23C 16/4412 |
| 2017/0032983 A1* | 2/2017 | Muta | G03F 7/16 |
| 2021/0028008 A1* | 1/2021 | Sano | H01L 21/02104 |

FOREIGN PATENT DOCUMENTS

| | | |
|---|---|---|
| JP | 2003-133197 A | 5/2003 |
| JP | 2005-502784 A | 1/2005 |
| JP | 2006091127 A | 4/2006 |
| JP | 2008-016765 A | 1/2008 |
| JP | 2008-016768 A | 1/2008 |
| JP | 2011044663 A * | 3/2011 |
| JP | 4666912 B2 | 4/2011 |
| KR | 10-2019-0004494 A | 1/2019 |
| KR | 10-2019-0090925 A | 8/2019 |
| KR | 10-2020-0097648 A | 8/2020 |
| KR | 10-2021-0011347 A | 2/2021 |

* cited by examiner

*Primary Examiner* — Parviz Hassanzadeh
*Assistant Examiner* — Margaret Klunk
(74) *Attorney, Agent, or Firm* — Harness, Dickey & Pierce, P.L.C.

(57) ABSTRACT

Provided is an apparatus for treating a substrate. The apparatus for treating the substrate includes a chamber having an inner space, a support unit configured to support the substrate in the inner space, a gas supply tube configured to supply a gas onto the substrate supported on the support unit, a gas exhaust tube configured to exhaust the gas from the inner space, and a gas block connected to the gas supply tube and the gas exhaust tube and provided above the chamber.

18 Claims, 9 Drawing Sheets

APPARATUS FOR TREATING SUBSTRATE

CROSS-REFERENCE TO RELATED APPLICATIONS

This U.S. non-provisional patent application claims priority under 35 U.S.C. § 119 of Korean Patent Application No. 10-2021-0076031, filed on Jun. 11, 2021, the entire contents of which are hereby incorporated by reference.

BACKGROUND

The present disclosure herein relates to an apparatus for treating a substrate.

To manufacture a semiconductor device, various processes such as cleaning, deposition, photography, etching, and ion implantation are performed. Among these processes, the deposition and a coating process are used as processes for forming a film on a substrate. Generally, the deposition process is a process of forming a film by depositing a process gas on a substrate, and the coating process is a process of forming a liquid film by applying a treating solution on the substrate.

Before and after forming the film on the substrate such as a wafer, a baking process of baking the substrate is performed. The baking process is a process of heating the substrate at a process temperature or more in a sealed space. In the baking process performed after forming the film on the substrate, a photoresist film applied on the substrate is heated and volatilized to adjust a thickness of the film to a set temperature. Generally, in the baking process, a gas is supplied onto the substrate. The gas effectively volatilizes the photoresist film applied on the substrate. In addition, the gas exhausts fume in a chamber, which performs the baking process, to the outside of the chamber. To precisely control the film thickness on the substrate, the gas has to be uniformly supplied onto the substrate, and the gas supplied onto the substrate has to be uniformly exhausted. When the gas is not uniformly supplied onto the substrate, or the gas is not uniformly exhausted, the film thickness on the substrate is not precisely controlled. When the film thickness on the substrate is different for each area of the substrate, a defect may occur in the semiconductor device to be manufactured.

SUMMARY

The present disclosure provides an apparatus for treating a substrate, which is capable of uniformly controlling a film applied on the substrate.

The present disclosure also provides an apparatus for treating a substrate, which is capable of uniformly supplying a gas onto the substrate during a heating process.

The present disclosure also provides an apparatus for treating a substrate, which is capable of uniformly exhausting a gas supplied onto the substrate during a heating process.

The present disclosure also provides an apparatus for treating a substrate, which is capable of minimizing an increase in area occupied by a heating unit performing a heating process on a substrate.

The objects of the present disclosure are not limited thereto, and other objects not mentioned will be clearly understood by those skilled in the art from the following description.

An embodiment of the inventive concept provides an apparatus for treating a substrate. The apparatus for treating the substrate includes: a chamber having an inner space; a support unit configured to support the substrate in the inner space; a gas supply tube configured to supply a gas onto the substrate supported on the support unit; a gas exhaust tube configured to exhaust the gas from the inner space; and a gas block connected to the gas supply tube and the gas exhaust tube and provided above the chamber.

In an embodiment, the gas block may have: a supply space configured to provide a supply path for the gas supplied from the gas supply tube; and an exhaust space configured to provide an exhaust path for the gas exhausted by the gas exhaust tube.

In an embodiment, the gas block may be disposed so that the supply space overlaps a central region of the inner space when viewed from above.

In an embodiment, the exhaust space may be defined to surround the supply space when viewed from above.

In an embodiment, at least one of the gas exhaust tube or the gas supply tube may be connected to a side portion of the gas block.

In an embodiment, the exhaust space may include a first region and a second region that is a region far from a position, at which the gas exhaust tube is connected to the exhaust space, than the first region, and the gas block may have an exhaust channel through which the first region is in fluid communication with the second region.

In an embodiment, the exhaust channel may be provided so that at least a portion of the exhaust channel overlaps the supply space when viewed from above.

In an embodiment, an upper end of the exhaust space may be defined higher than an upper end of the supply space, and the exhaust channel may be defined above the supply space when viewed from front.

In an embodiment, the exhaust channel may include: a first exhaust channel; and a second exhaust channel provided to cross the first exhaust channel when viewed from above.

In an embodiment, when viewed from above, a crossing angle between the first exhaust channel and the second exhaust channel may range of about 70 degrees to about 110 degrees.

In an embodiment of the inventive concept, an apparatus for treating a substrate is provided. The apparatus for treating the substrate includes: a chamber having an inner space; a support unit configured to support the substrate in the inner space and adjust a temperature of the substrate; and a gas supply tube configured to supply a gas into the inner space or exhaust the gas from the inner space, wherein the gas unit includes: a gas block provided above the chamber and having a supply space configured to provide a supply path for the gas and an exhaust space configured to provide an exhaust path for the gas; a gas supply tube connected to the supply space; and a gas exhaust tube connected to the exhaust space.

In an embodiment, at least one of the gas supply tube or the gas exhaust tube may be connected to a side portion of the gas block.

In an embodiment, the supply space may be defined in a central region of the gas block when viewed from above, and the exhaust space may be defined in an edge region of the gas block to surround the supply space.

In an embodiment, the exhaust space may include a first region and a second region that is a region far from a position, at which the gas exhaust tube is connected to the exhaust space, than the first region, and the gas block may have an exhaust channel through which the first region is in fluid communication with the second region.

In an embodiment, the exhaust channel may include: a first exhaust channel; and a second exhaust channel provided to cross the first exhaust channel when viewed from above.

In an embodiment, a crossing point between the first exhaust channel and the second exhaust channel may be disposed on a virtual straight line extending from the gas exhaust tube, and a crossing angle between the first exhaust channel and the second exhaust channel may range of about 70 degrees to about 110 degrees.

In an embodiment, the exhaust channel may be provided so that at least a portion of the exhaust channel overlaps the supply space when viewed from above, and the exhaust channel may be provided above the supply space when viewed from the front.

In an embodiment, the chamber may include: a housing having an opened upper portion; a cover disposed above the housing and combined with the housing to define the inner space; and a gap block configured to define a gap between the housing and the cover.

In an embodiment, the chamber may include: a housing having an opened upper portion; and a cover disposed above the housing, combined with the housing to define the inner space, and provided with an exhaust path that is in fluid communication with the exhaust space, wherein the gas unit may include a baffle installed in the cover and disposed to face the gas supplied from the supply space.

In an embodiment of the inventive concept, an apparatus for treating a substrate is provided. The apparatus for treating the substrate includes: a chamber having an inner space; a support unit configured to support the substrate in the inner space and heat the substrate; and a gas unit configured to supply a gas into the inner space or exhaust the gas from the inner space, wherein the chamber include: a housing having an opened upper portion; and a cover disposed above the housing to define an exhaust path, wherein the gas unit includes: a gas block provided above the chamber and having a supply space configured to provide a supply path for the gas and an exhaust space configured to provide an exhaust path for the gas; a gas supply tube connected to the supply space; a gas exhaust tube connected to the exhaust space; and a baffle installed in the cover and disposed to face the gas supplied from the supply space, wherein the exhaust space includes a first region and a second region that is a region far from a position, at which the gas exhaust tube is connected to the exhaust space, than the first region, wherein an exhaust channel configured to allow the first region and the second region to be in fluid communication with each other is provided in the gas block, and wherein the exhaust channel includes: a first exhaust channel; and a second channel configured to cross the first exhaust channel when viewed from above.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
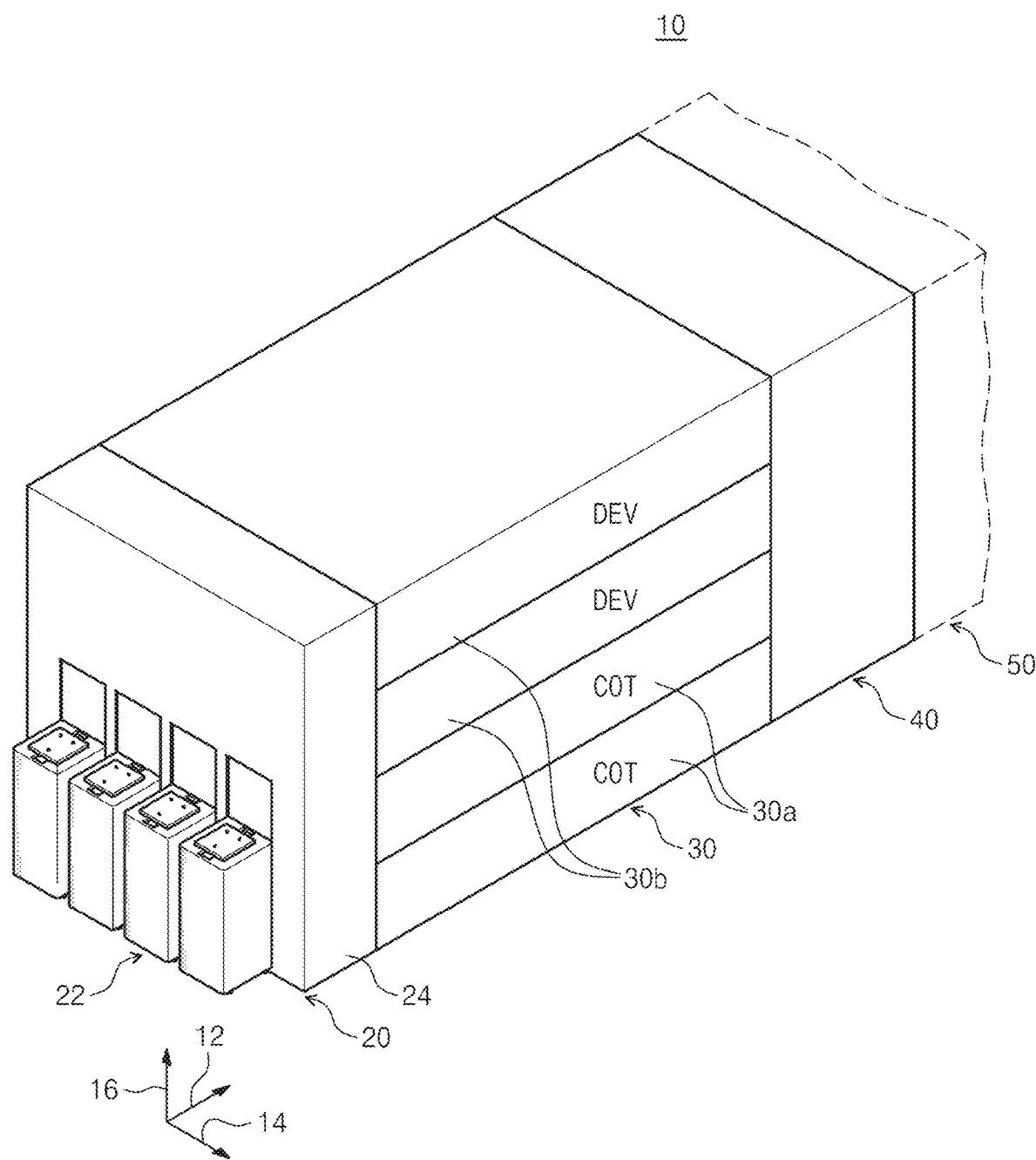
FIG. 1 is a schematic perspective view illustrating an apparatus for treating a substrate according to an embodiment of the inventive concept.

Preferred embodiments of the inventive concept will be described below in more detail with reference to the accompanying drawings. The embodiment of the inventive concept may, however, be embodied in different forms and should not be constructed as limited to the embodiments set forth herein. Rather, these embodiments are provided so that this disclosure will be thorough and complete, and will fully convey the scope of the present disclosure to those skilled in the art. In the drawings, the thicknesses of layers and regions are exaggerated for clarity.

Figure 2:
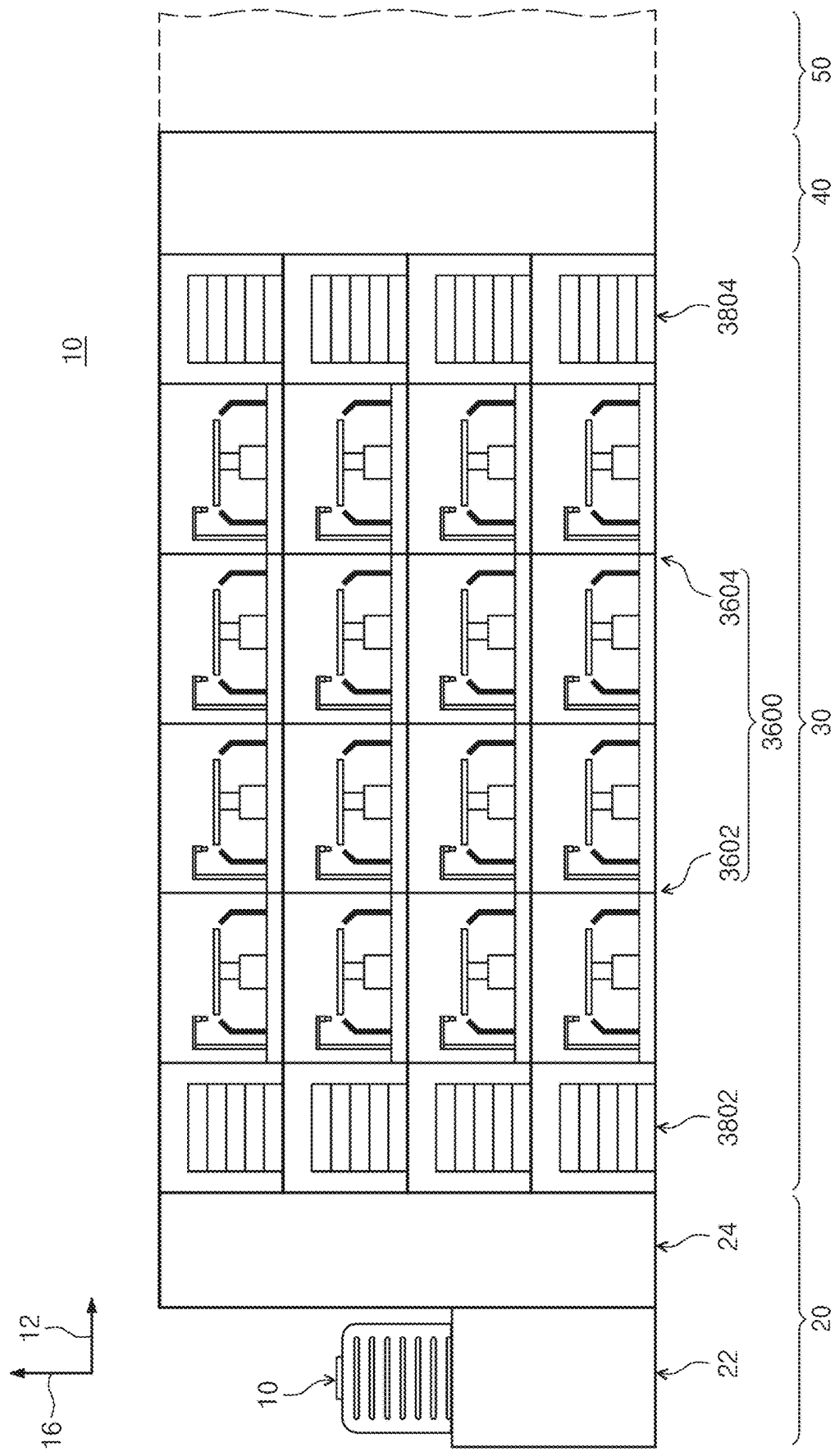
FIG. 2 is a cross-sectional view illustrating a coating block and a developing block of FIG. 1 in the apparatus for treating the substrate.
Figure 3:
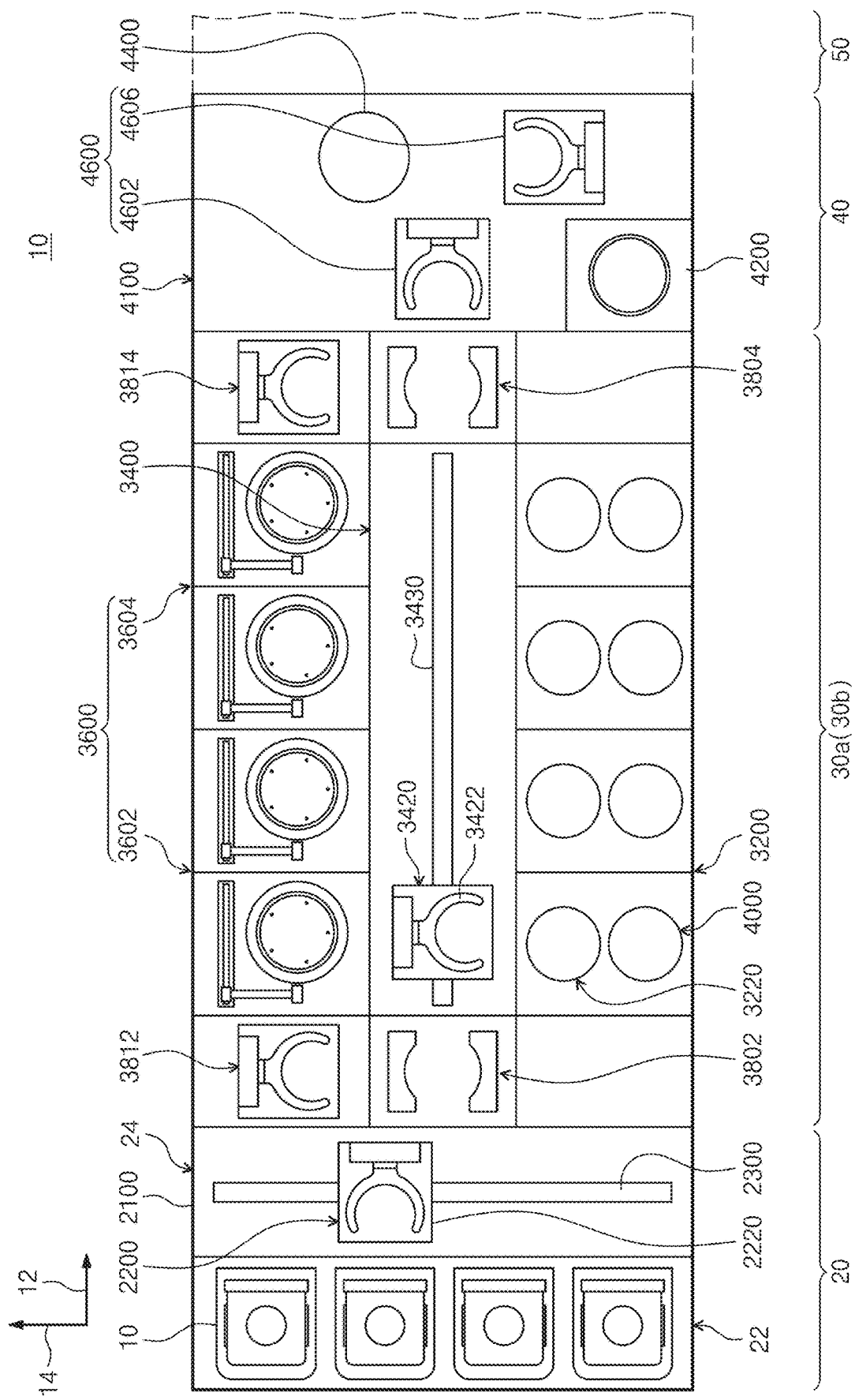
FIG. 3 is a plan view of the apparatus for treating the substrate of FIG. 1.

FIG. 1 is a schematic perspective view illustrating an apparatus for treating a substrate according to an embodiment of the inventive concept, FIG. 2 is a cross-sectional view illustrating a coating block and a developing block of FIG. 1 in the apparatus for treating the substrate, and FIG. 3 is a plan view of the apparatus for treating the substrate of FIG. 1.

Referring to FIGS. 1 to 3, an apparatus 1 for treating a substrate 1 includes an index module 20, a treating module 30, and an interface module 40. According to an embodiment, the index module 20, the treating module 30, and the interface module 40 are sequentially arranged in a line. Hereinafter, a direction in which the index module 20, the treating module 30, and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 transfers a substrate W from a container 10, in which the substrate W is accommodated, to the treating module 30 and accommodates the treated substrate W in the container 10. A longitudinal direction of the index module 20 is provided in the second direction 14. The index module 20 includes a load port 22 and an index frame 24. With reference to the index frame 24, the load port 22 is disposed at an opposite side of the treating module 30. The container 10 in which the substrates W are accommodated is placed on the load port 22. The load port 22 may be provided in plurality, and the plurality of load ports 22 may be disposed along the second direction 14.

The sealed container 10 such as a front open unified pod (FOUP) may be used as the container 10. The container 10 may be placed on load port 22 by an operator or by a transfer unit (not shown) such as an overhead transfer, an overhead conveyor, or an automatic guided vehicle.

An index robot 2200 is provided inside the index frame 24. A guide rail 2300 having a longitudinal direction in the second direction 14 may be provided in the index frame 24, and the index robot 2200 may be provided to be movable on the guide rail 2300. The index robot 2200 may include a hand 2220 on which the substrate W is placed, and the hand 2220 may move forward and backward and rotate about the third direction 16 and also be provided to be movable along the third direction 16.

The treating module 30 performs a coating process and a developing process on the substrate W. The treating module 30 includes a coating block 30a and a developing block 30b. The coating block 30a performs the coating process on the substrate W, and the developing block 30b performs the development process on the substrate W. A coating block 30a is provided in plurality, and the plurality of coating blocks 30a are provided to be stacked on each other. The developing block 30b is provided in plurality, and the plurality of developing blocks 30b are provided to be stacked on each other. According to the embodiment of FIG. 1, two coating blocks 30a are provided, and two development blocks 30b are provided. The coating blocks 30a may be disposed below the developing blocks 30b. According to an example, the two coating blocks 30a may perform the same process as each other and may be provided in the same structure. In addition, the two developing blocks 30b may perform the same process as each other and may be provided in the same structure.

Referring to FIG. 3, the coating block 30a includes a heat treating chamber 3200, a transfer chamber 3400, a liquid treating chamber 3600, and a buffer chamber 3800. The heat treating chamber 3200 performs a heat treating process on the substrate W. The heat treating process may include a cooling process and a heating process. The liquid treating chamber 3600 supplies a liquid onto the substrate W to form a liquid film. The liquid film may be a photoresist film or an antireflection film. The transfer chamber 3400 transfers the substrate W between the heat treating chamber 3200 and the liquid treating chamber 3600 in the coating block 30a.

The transfer chamber 3400 is provided so that its longitudinal direction is parallel to the first direction 12. A transfer robot 3422 is provided in the transfer chamber 3400. The transfer robot 3422 transfers the substrate between the heat treating chamber 3200, the liquid treating chamber 3600, and the buffer chamber 3800. According to an embodiment, the transfer robot 3420 may include a hand 3422 on which the substrate W is placed, and the hand 3422 may move forward and backward and rotate about the third direction 16 and also be provided to be movable along the third direction 16. A guide rail 3300 having a longitudinal direction parallel to the first direction 12 is provided in the transfer chamber 3400, and the transfer robot 3422 may be provided movably on the guide rail 3300.

Figure 4:
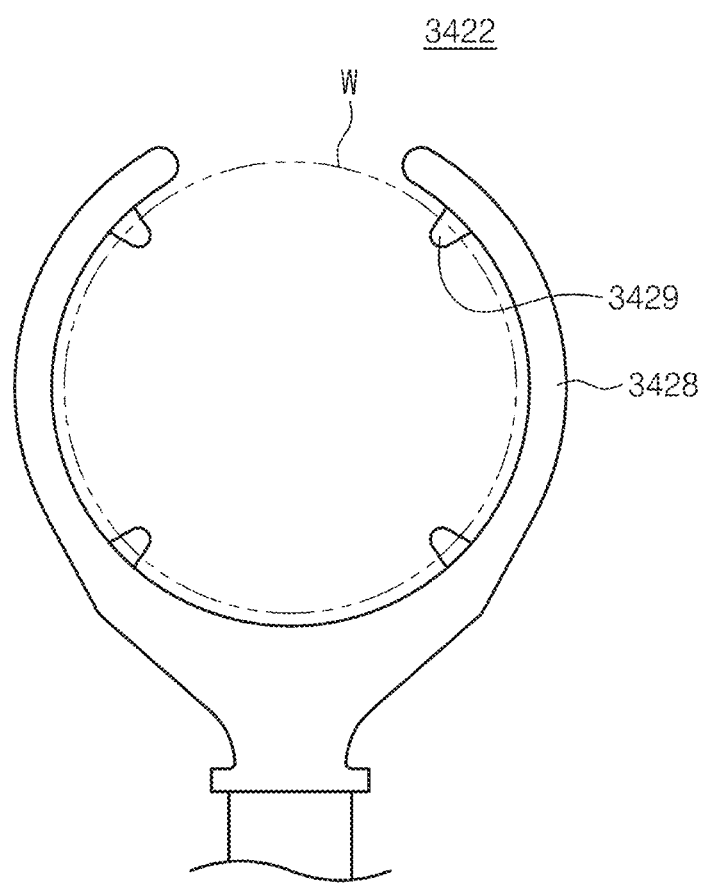
FIG. 4 is a view illustrating an example of a hand of a transfer robot of FIG. 3.
Figure 7:
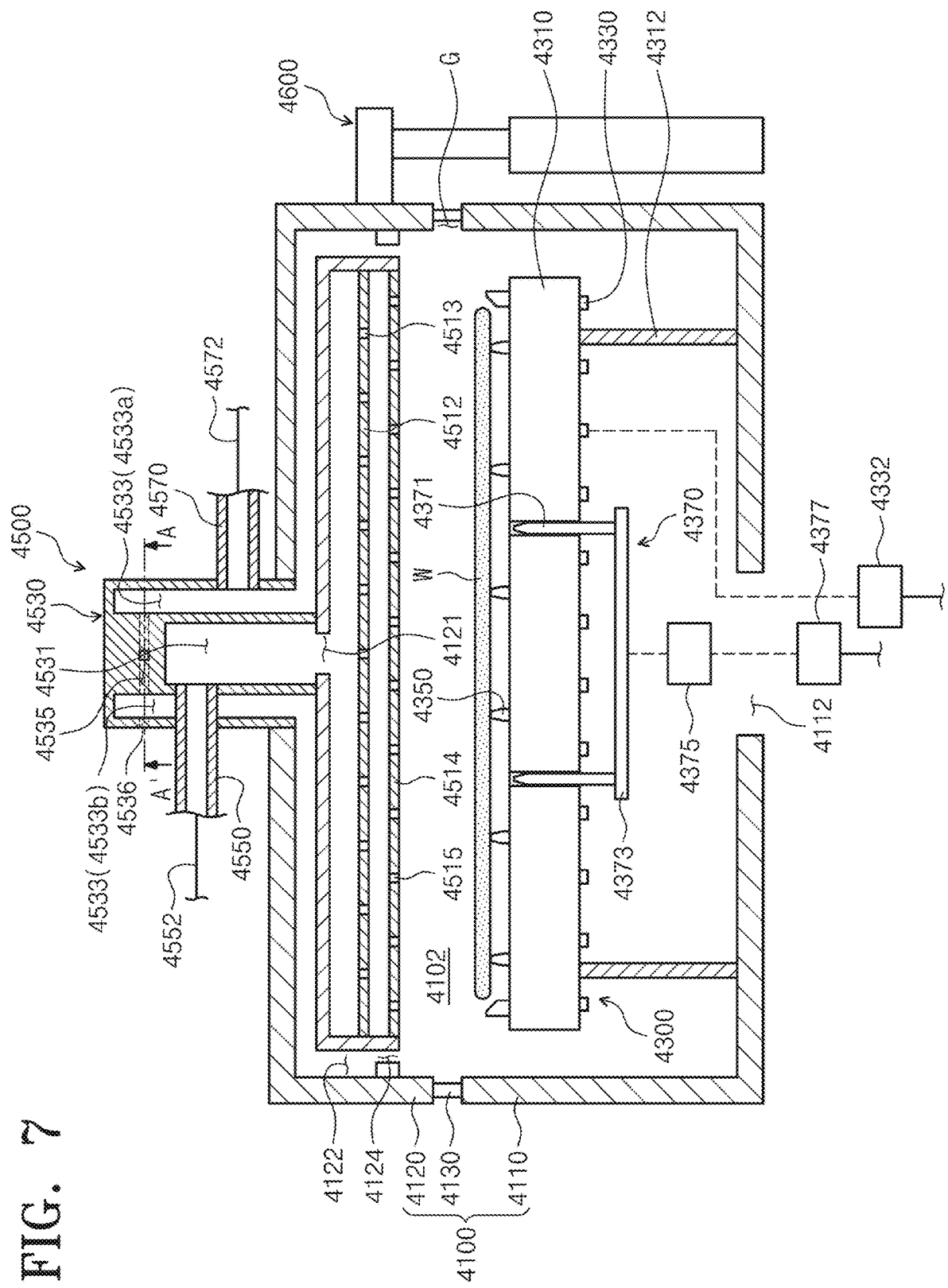
FIG. 7 is a view illustrating the apparatus for treating the substrate, which is provided in a heating unit of FIG. 6.

FIG. 4 is a view illustrating an example of the hand of the transfer robot of FIG. 1. Referring to FIG. 7, the hand 3422 includes a base 3428 and a support protrusion 3429. The base 3428 may have an annular ring shape of which a portion of the circumference is bent. The base 3428 has an inner diameter greater than a diameter of the substrate W. The support protrusion 3429 extends inward from the base 3428. The support protrusion 3429 is provided in plurality to support an edge area of the substrate W. According to an embodiment, four support protrusions 3429 may be provided at equal intervals.

The heat treating chamber 3200 is provided in plurality. The heat treating chambers 3200 are arranged in a row along the first direction 12. The heat treating chambers 3200 are disposed at one side of the transfer chamber 3400.

Figure 5:
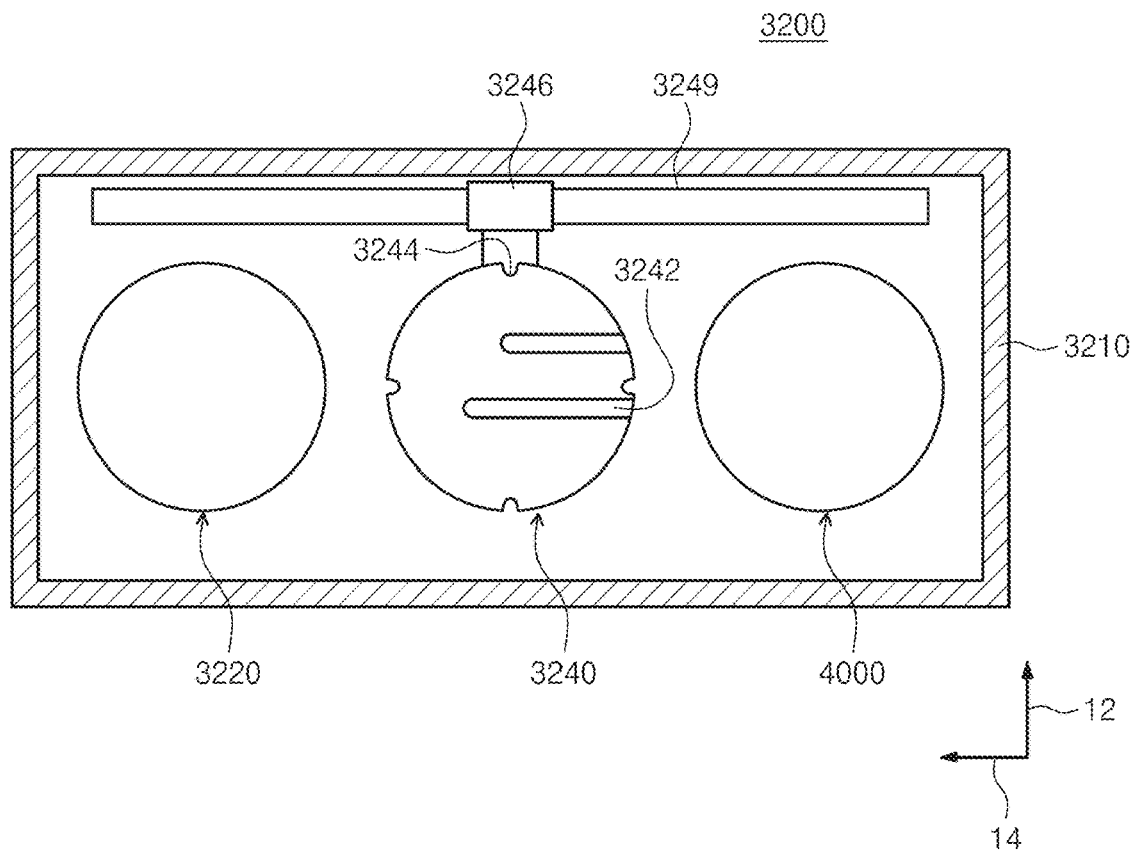
FIG. 5 is a schematic plan view illustrating an example of a heat treating chamber of FIG. 3.
Figure 6:
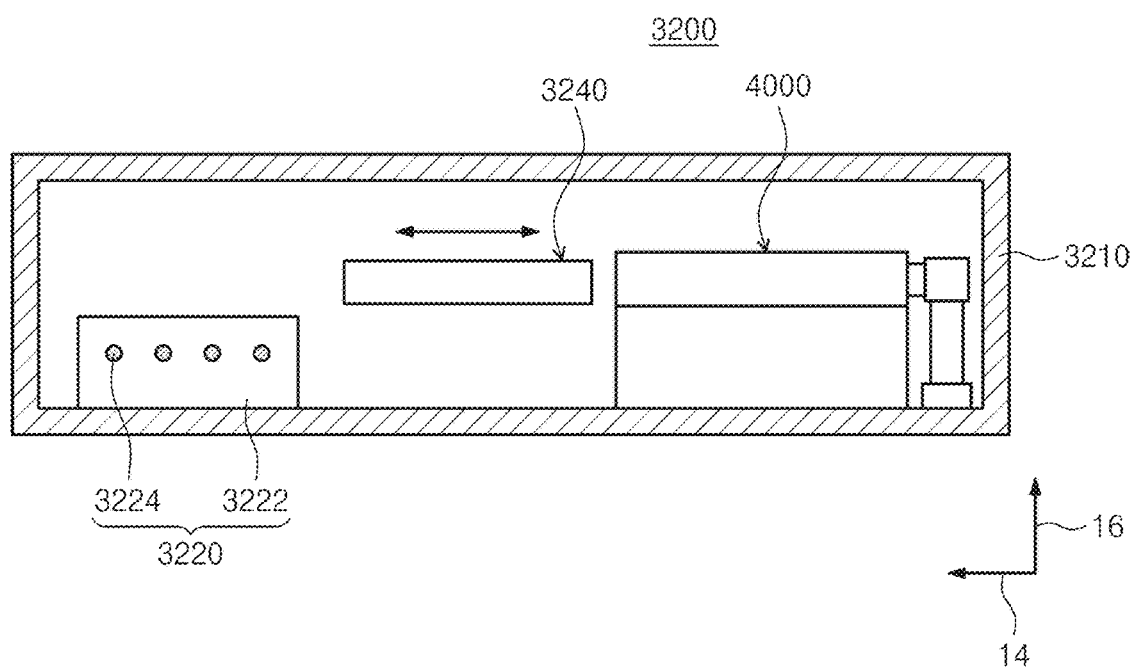
FIG. 6 is a front view of the heat treating chamber of FIG. 5.

FIG. 5 is a schematic plan view illustrating an example of the heat treating chamber of FIG. 3, and FIG. 6 is a front view of the heat treating chamber of FIG. 5. Referring to FIGS. 5 and 6, the heat treating chamber 3200 includes a housing 3210, a cooling unit 3220, a heating unit 4000, and a transfer plate 3240.

The housing 3210 is provided in a substantially rectangular parallelepiped shape. An inlet (not shown) through which the substrate W enters and exits is defined in a sidewall of the housing 3210. The inlet may remain in an opened state. Optionally, a door (not shown) may be provided to open and close the inlet. The cooling unit 3220, the heating unit 4000, and the transfer plate 3240 are provided in the housing 3210. The cooling unit 3220 and the heating unit 4000 are provided side by side along the second direction 14. According to an embodiment, the cooling unit 3220 may be disposed closer to the transfer chamber 3400 than the heating unit 4000.

The cooling unit 3220 includes a cooling plate 3222. The cooling plate 3222 may have a generally circular shape when viewed from above. A cooling member 3224 is provided on the cooling plate 3222. According to an embodiment, the cooling member 3224 may be disposed inside the cooling plate 3222 and may be provided as a passage through which a cooling fluid flows.

The heating unit 4000 is provided as a device for heating the substrate at a temperature higher than room temperature. The heating unit 4000 heats the substrate W under a reduced pressure atmosphere at a normal pressure or less. The heating unit 4000 may perform a baking process on the substrate W. The heating unit 4000 may be provided with the apparatus 3300 for treating the substrate that perform the baking process on the substrate W.

FIG. 7 is a view illustrating the apparatus for treating the substrate, which is provided in the heating unit of FIG. 6. Referring to FIG. 7, the heating unit 4000 may include a chamber 4100, a support unit 4300, a gas unit 4500, and an elevation unit 4600. The heating unit 4000 performs the baking process. The baking process may stabilize a film applied on the substrate W, for example, a photoresist film. In addition, in the baking process, a thickness of the film applied on the substrate W may be adjusted to a set thickness.

The chamber 4100 may have an inner space 4102 in which the substrate W is treated. The chamber 4100 may include a housing 4110, a cover 4120, and a gap block 4130. The housing 4110 and the cover 4120 may be combined with each other to define the inner space 4102. The housing 4110 may have a container shape with an upper portion opened. The housing 4110 may have a cylindrical shape with an upper portion opened. An opening 4112 may be defined in a lower portion and a central region of the housing 4110. Various interface lines that are necessary for driving the support unit 4300 may pass through the opening 4112. For example, a power line connecting a heater power source 4332 and a heater 4330 to be described later or a power line connecting the driving power source 4377 to the driver 4375 to each other may pass.

The cover 4120 may cover the upper portion of the housing 4110. The cover 4120 may be provided to be movable in a vertical direction by the elevation unit 4600.

The cover 4120 may move vertically by the elevation unit 4600 and may be combined with the housing 4110 to define the inner space.

The cover 4120 may include an outer wall and an inner wall. The outer wall 41230 and a space between the outer walls may define an exhaust path 4122 through which a gas supplied by the gas unit 4500 to be described later is exhausted. The exhaust path 4122 may be in fluid communication with the inner space 4102 using the exhaust hole 4124 as a medium. Also, the exhaust path 4122 may be in fluid communication with an exhaust space 4533 of a gas block 4530 to be described later. In addition, the exhaust hole 4124 may be defined in an edge region of the inner space 4102 when viewed from above. The exhaust hole 4124 may be defined in plurality. A plurality of exhaust holes 4124 may be defined to be spaced apart from each other. The cover 4120 may have a circular shape when viewed from above. The exhaust holes 4124 may be defined along an edge region of the cover 4120 when viewed from above. The exhaust holes 4124 may be defined to be spaced apart from each other in a circumferential direction. In addition, a supply opening 4121 that is in direct fluid communication with a supply space 4531 of the gas block 4530 to be described later may be defined in the inner wall of the cover 4120. In addition, an exhaust opening that is in direct fluid communication with an exhaust space 4533 of the gas block 4530 to be described later may be defined in the outer wall of the cover 4120.

Figure 8:
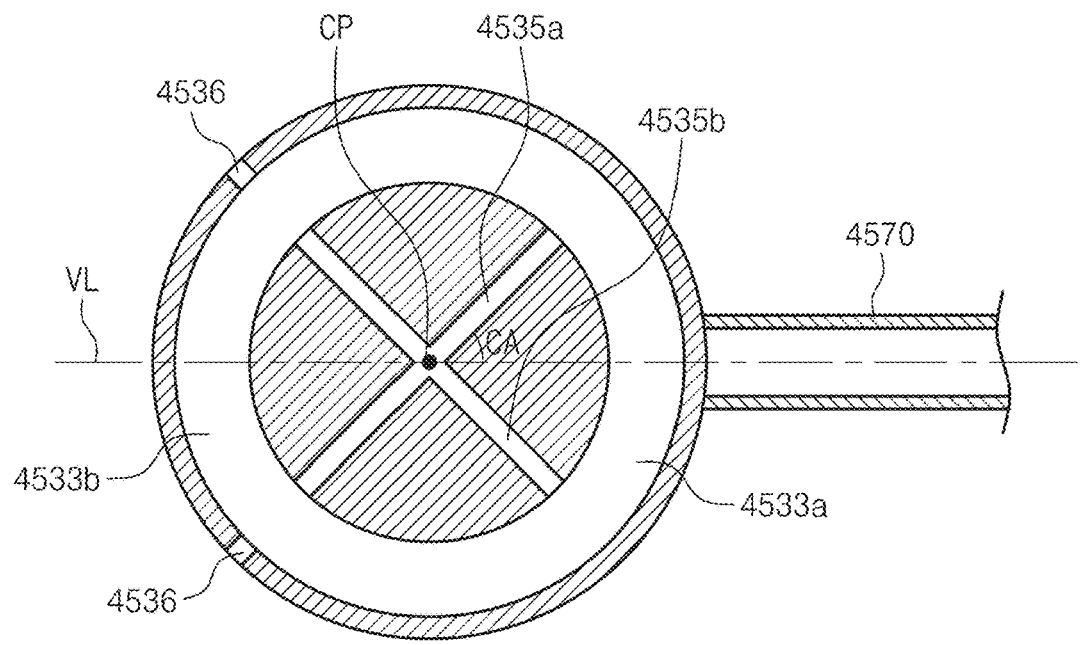
FIG. 8 is a view illustrating a housing and a cap block of FIG. 7.

Also, gaps G and Gap may be defined between the housing 4110 and the cover 4120. For example, as illustrated in FIG. 8, a groove may be defined in the housing 4110, and the gap block 4130 may be fitted into the groove. The gap block 4130 may be provided in plurality, and the number of grooves defined in the housing 4110 may correspond to the number of gap blocks 4130. An upper end of the gap block 4130 may be in contact with the cover 4120. A gap may be defined between the housing 4110 and the cover 4120 by the gap block 4130.

Referring again to FIG. 7, the support unit 4300 may support the substrate W. The support unit 4300 may support the substrate W in the inner space 4102. The support unit 4300 may adjust the temperature of the substrate W. For example, the support unit 4300 may heat the substrate W.

The support unit 4300 may include a heating plate 4310, a heater 4330, support pins 4350, and a lift pin module 4370. The heating plate 4310 may have a plate shape. The heating plate 4310 may be made of a material having high thermal conductivity. The heating plate 4310 may be made of a material including a metal. The heating plate 4310 may receive heat from a heater 4330 to be described later to transfer the heat generated by the heater 4330 to the substrate. The heating plate 4310 may be installed to be spaced apart from a bottom surface of the housing. The heating plate 4310 may be supported by a support member 4312. The support member 4312 may have a bar shape. The support member 4312 may be provided in plurality. The support member 4312 may be provided in plurality to separate a bottom surface of the heating plate 4310 from the bottom surface of the housing.

The heater 4330 may heat the heating plate 4310. The heater 4330 may be provided on the bottom surface of the heating plate 4310. In the heater 4330, the bottom surface of the heating plate 4310 may be provided in the form of a pattern. The heater 4330 may receive power from the heater power source 4332 to generate heat. The heat generated by the heater 4330 may be transferred to the heating plate 4310. The heat transferred to the heating plate 4310 may be transferred to the substrate. In the above-described example, it has been described that the heater 4330 is attached to the bottom surface of the heating plate 4310 in the form of the pattern as an example, but the embodiment of the inventive concept is not limited thereto. For example, the heater 4330 may be embedded in the heating plate 4310. For example, the heater 4330 may be provided in the form of a coil.

The support pin 4350 may support the bottom surface of the substrate W. The support pin 4350 may separate the bottom surface of the substrate W and a top surface of the heating plate 4310 by a predetermined distance during the heating process. The support pin 4350 may be provided in plurality. The support pin 4350 may be installed on the heating plate 4310. A height of an upper end of the support pin 4350 may be fixed.

The lift pin module 4370 may allow the substrate to move in the vertical direction. The lift pin module 4370 may load or unload the substrate W to/from the support unit 4300. The lift pin module 4370 may include a lift pin 4371, an elevation plate 4373, and a driver 4375. The lift pin may be fixedly installed on the elevation plate. The lift pin 4371 may be inserted into a lift pin hole defined in the heating plate 4310. The elevation plate 4373 may move in the vertical direction by receiving driving force from the actuator 4375, which may be a cylinder or a motor. The driver 4375 may receive power from the driving power source 4377 to generate driving force.

The gas unit 4500 may supply a gas to the inner space 4102. The gas may be external air. The gas supplied by the gas unit 4500 may be clean air. The gas supplied by the gas unit 4500 may be a gas of which a temperature and humidity are adjusted. The gas unit 4500 may form a downdraft in the inner space 4102. In addition, the gas unit 4500 may exhaust the gas supplied to the inner space 4102. The gas unit 4500 may exhaust the gas supplied to the inner space 4102 to discharge process byproducts such as fume that may be generated in the inner space 4102 to the outside.

The gas unit 4500 may include a first baffle 4512, a second baffle 4514, a gas block 4530, a gas supply tube 4550, and a gas exhaust tube 4570.

The first baffle 4512 and the second baffle 4514 may be collectively referred to as a baffle unit. A plurality of first holes 4513 may be defined in the first baffle 4512. A plurality of second holes 4515 may be defined in the second baffle 4514. The first baffle 4512 and the second baffle 4514 may be installed on the inner wall of the cover 4120. When the gas supplied by the gas supply tube 4550 flows into the inner space 4102 through the supply opening 4521, the first baffle 4512 and the second baffle 4514 may be in contact with the gas introduced into the inner space 4102. The first holes 4514 and the second holes 4515 respectively defined in the first baffle 4512 and the second baffle 4514 may be defined so as not to overlap each other when viewed from above. Thus, the gas flowing into the inner space 4102 through the supply opening 4521 may be dispersed by the first baffle 4512 and the second baffle 4514. The dispersed gas may be uniformly supplied onto the substrate W supported in the inner space 4102.

Figure 9:
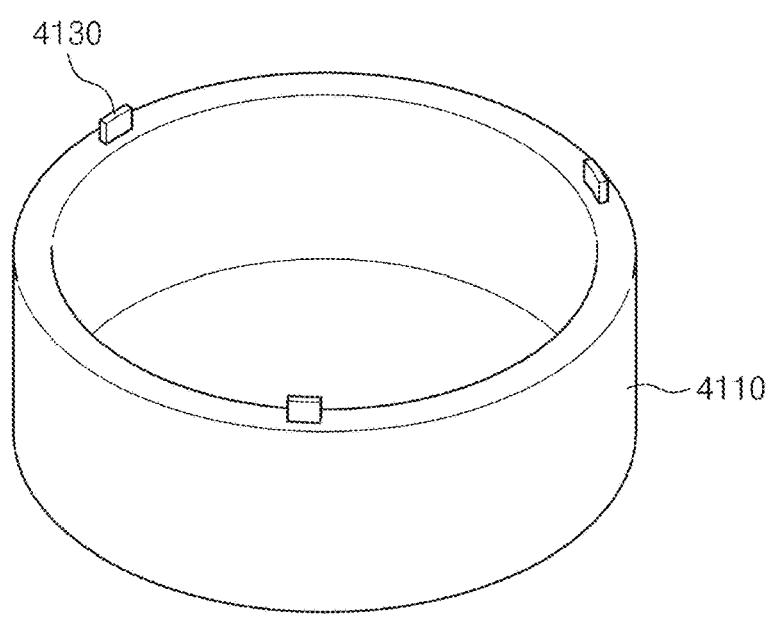
FIG. 9 is a view of a gas block, taken along line A-A' of FIG. 7.

FIG. 9 is a view of the gas block, taken along line A-A' of FIG. 7. Referring to FIGS. 7 and 9, the gas block 4530 may be provided above the chamber 4100. The gas block 4530 may be provided in a central region above the chamber 4100. The gas block 4530 may be provided by being inserted into a central region of an upper portion of the cover 4120. Alternatively, the gas block 4530 may be provided to be integrated with the cover 4120. The gas block 4530 may be connected to the gas supply tube 4550 and the gas exhaust tube 4570. The gas supply tube 4550 may be connected to a gas supply line 4552. The gas exhaust tube 4570 may be connected to a gas exhaust line 4572. The gas supply tube 4550 and the gas exhaust tube 4570 may be connected to the side portion of the gas block 4530. This is because, when the gas supply tube 4550 and/or the gas exhaust tube 4570 are connected to the upper portion of the gas block 4530, an area occupied by the heating unit 4000 may greatly increase. According to an embodiment of the inventive concept, the gas supply tube 4550 and/or the gas exhaust tube 4570 may be connected to the side portion of the gas block 4530 to minimize the increase in area.

A supply space 4531, an exhaust space 4533, and an exhaust channel 4535 may be defined in the gas block 4530. The supply space 4531 may provide a supply path for the gas supplied from the gas supply tube 4550. The supply space 4531 may be in direct communication with the above-described supply opening 4121. The supply space 4531 may directly communicate with the flow path of the gas supply tube 4550. The supply space 4531 may be defined in the central region of the gas block 4530 when viewed from above. The supply space 4531 may be defined by being recessed from the bottom surface of the gas block 4530 in a direction from below end to above. The supply space 4531 may overlap the central area of the inner space 4102 when viewed from above.

The exhaust space 4533 may be defined to surround the supply space 4531 when viewed from above. The exhaust space 4533 may be a space directly communicating with the above-described exhaust path 4122. An upper end of the exhaust space 4533 may be defined higher than an upper end of the supply space 4531. A lower end of the exhaust space 4533 may be defined higher than a lower end of the supply space 4531. The exhaust space 4533 may provide an exhaust path for the gas exhausted by the gas exhaust tube 4570.

The exhaust space 4533 may include a first region 4533a and a second region 4533b. Each of the first region 4533a and the second region 4533b may be a partial region of the exhaust space 4533. The first region 4533a may be closer to the gas exhaust tube 4570 than the second region 4533b. When viewed from above, the first region 4533a may be defined as a region of the exhaust space 4533 adjacent to the gas exhaust tube 4570, and the second region 4533b may be defined as a region of the exhaust area 4533, which is relatively far from the gas exhaust tube 4570.

The exhaust channel 4533 may provide fluid communication between the first region 4533a and the second region 4533b. The exhaust channel 4533 may provide a straight fluid path between the first region 4533a and the second region 4533b. The exhaust channel 4533 may be provided in a drilling manner of machining the side portion of the gas block 4530 by using a drill. A hole defined by the drilling manner may be closed by a sealing member 4536.

The exhaust channel 4533 may be provided at a position where at least a portion overlaps with the supply space 4531 when viewed from above. The exhaust channel 4533 may be provided above the supply space 4531 when viewed from the front cross-section of the gas block 4530.

Also, the exhaust channel 4533 may be provided in plurality. For example, the exhaust channel 4533 may include a first exhaust channel 4533a and a second exhaust channel 4533b. The first exhaust channel 4533a and the second exhaust channel 4533b may be disposed to cross each other. When viewed from above, a crossing angle CA between the first exhaust channel 4533a and the second exhaust channel 4533b may be about 70 degrees to about 90 degrees. Table below is a table detected by a three sigma method, which shows singular values of an average flow velocity of a gas flowing in the exhaust space 4533 according to a change in crossing angle CA.

TABLE 1

| Crossing angle | 50 degrees | 70 degrees | 90 degrees |
|---|---|---|---|
| 3 σ | 0.00564 | 0.00403 | 0.00395 |

Figure 10:
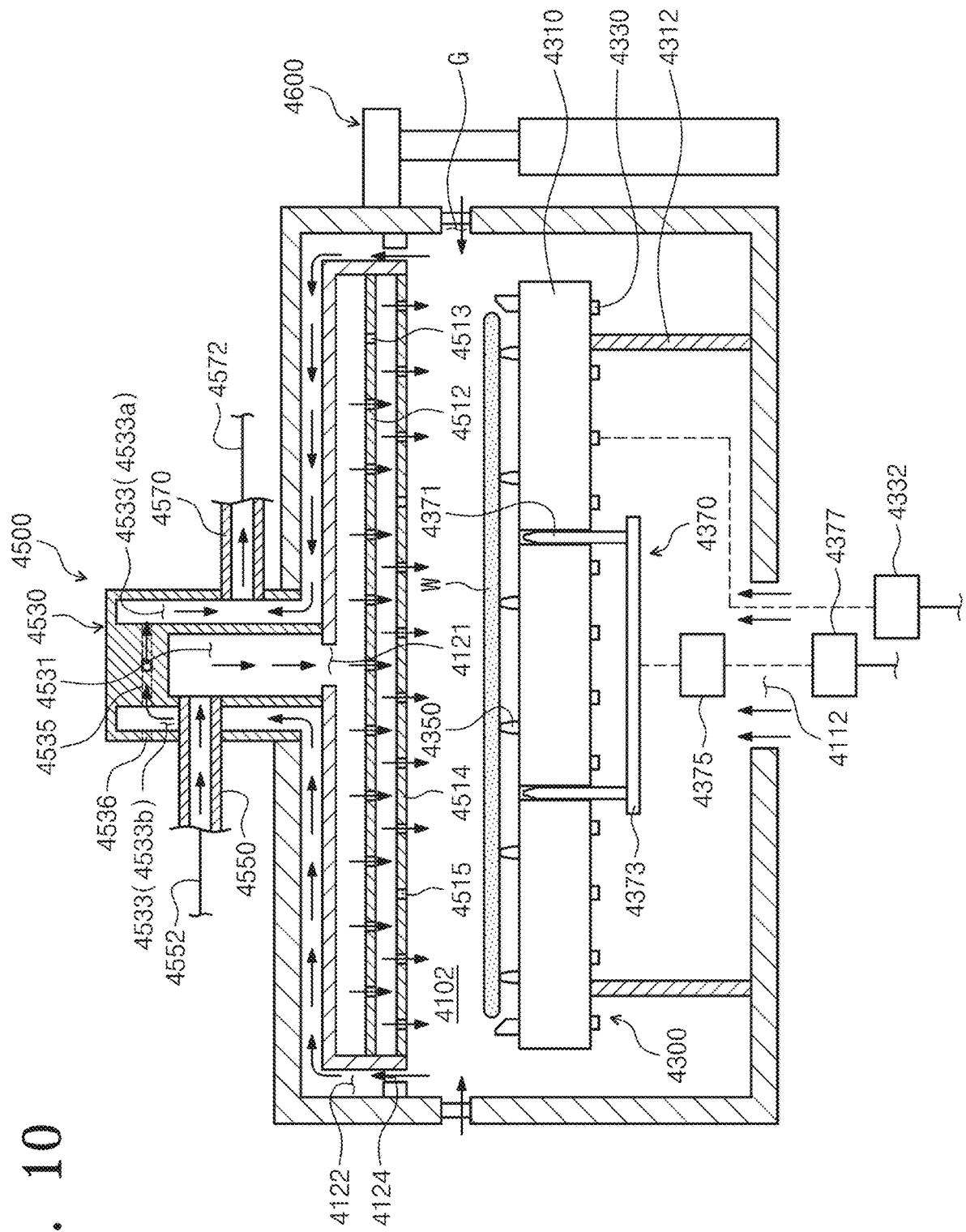
FIG. 10 is a view illustrating a state in which the apparatus for treating the substrate of FIG. 7 treats the substrate.

In order for the exhausted gas to be exhausted at a uniform speed, the crossing angle CA may be about 70 degrees to 90 degrees. The crossing angle CA may be 90 degrees. In addition, when viewed from above, a virtual crossing point CP of the first exhaust channel 4533a and the second exhaust channel 4533b may be disposed on a virtual straight line VL extending from a center of the gas exhaust tube 4570. FIG. 10 is a view illustrating a state in which the apparatus for treating the substrate of FIG. 7 treats a substrate. Referring to FIG. 10, a gas supplied by the gas supply tube 4550 may be supplied onto the substrate W through the gas supply tube 4550, the supply space 4531, the supply opening 4121, the first hole 4512, and the second hole 4515. The gas supplied from the gas supply tube 4550 may be uniformly diffused by the first baffle 4512 and the second baffle 4514 so as to be supplied onto the substrate W.

Figure 11:
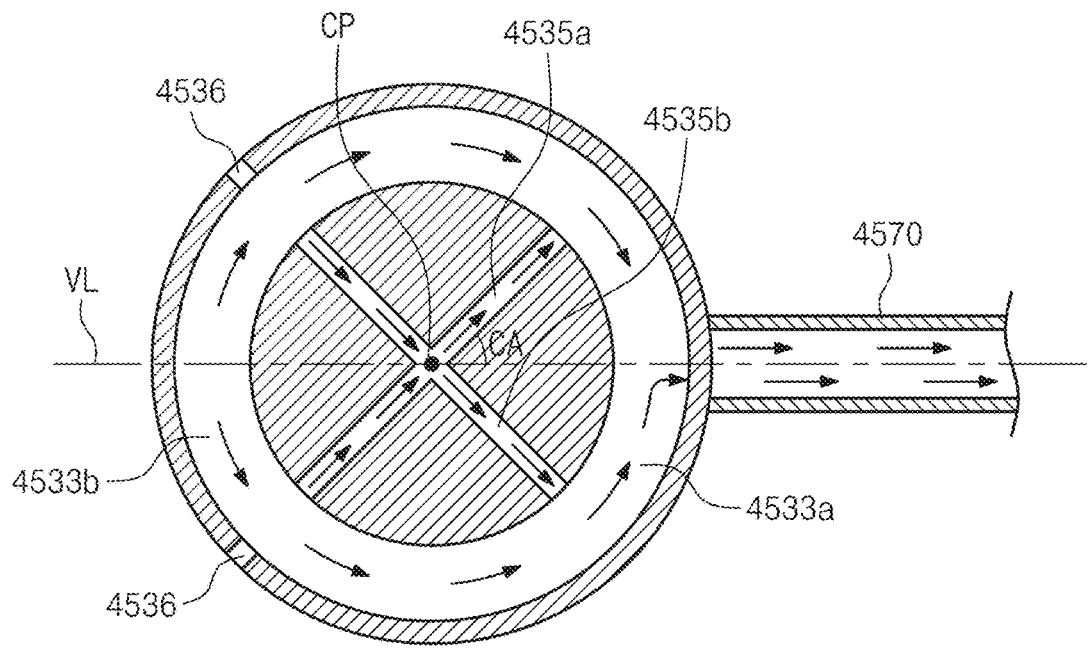
FIG. 11 is a view illustrating a state in which a gas flows in the gas block of FIG. 7.

A path through which the gas of the inner space 4102 is exhausted by the gas exhaust tube 4570 may be exhausted from the inner space 4102 through the inner space 4102, the exhaust hole 4124, the exhaust path 4122, the exhaust space 4533, and the exhaust tube 4570. The gas flowing into the first region 4533a of the exhaust space 4533 may be directly introduced into the gas exhaust tube 4570. The gas flowing into the second region 4533b of the exhaust space 4533 may be introduced into the gas exhaust tube 4570 through the exhaust channel 4535 and the first region 4533a as illustrated in FIG. 11.

When the gas supply tube 4550 and the gas exhaust tube 4570 are connected to the side portion of the gas block 4530, the supply and exhaust of the gas may not be uniformly performed. In order to solve this limitation, a method of connecting the gas supply tube 4550 and the gas exhaust tube 4570 to the upper portion of the gas block 4530 may be considered, but this is not preferable because of increasing in area of the heating unit 4000. Thus, according to an embodiment of the inventive concept, the increase in area (particularly, top and bottom areas) occupied by the heating unit 4000 may be minimized by connecting the gas supply tube 4550 and the gas exhaust tube 4570 to the side portion of the gas block 4530. In addition, the first baffle 4512 and the second baffle 4514 are disposed to uniformly supply the gas.

Figure 12:
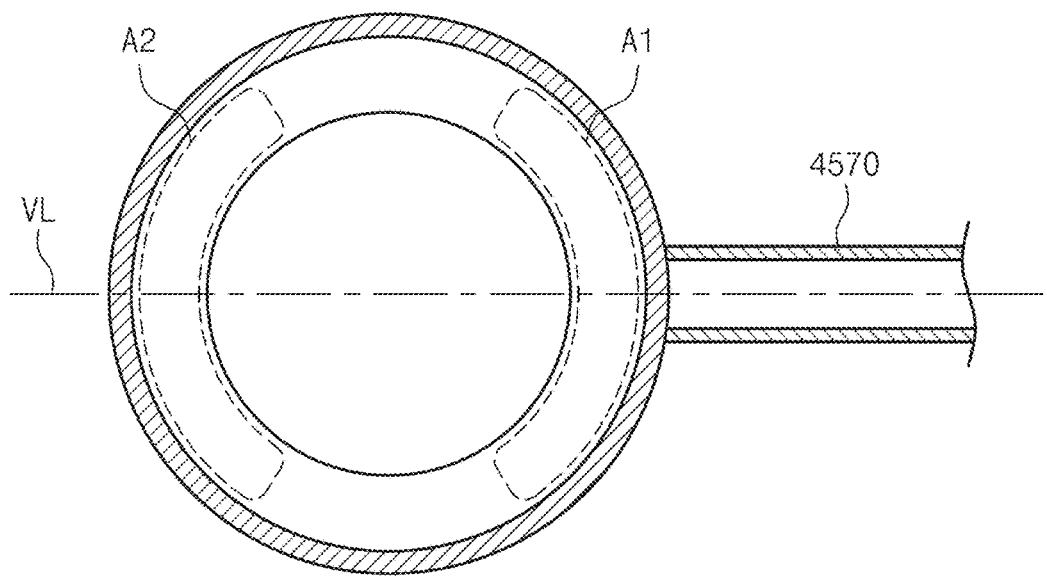
FIG. 12 is a view illustrating a comparative example, in which an exhaust channel is not provided in the gas block of FIG. 7.

In addition, in order to uniformly exhaust gas, an exhaust channel 4533 is provided in the gas block 4530. Particularly, as illustrated in FIG. 12, when the exhaust channel 4533 is not provided in the gas block 4530, a gas exhaust velocity on an area A1 adjacent to the gas exhaust tube 4570 is different from a gas exhaust velocity on an area A2 that is far from the gas exhaust tube 4570. Specifically, the gas exhaust velocity on the area A1 is faster. In this case, the gas supplied to the inner space 4102 may not be uniformly exhausted. However, as in the embodiment of the inventive concept illustrated in FIG. 11, when the exhaust channel 4533 is provided, an occurrence of a difference in exhaust velocity between the first region 4533a and the second region 4533b may be alleviated.

Referring again to FIGS. 4 and 5, a plurality of liquid treating chambers 3600 are provided. Some of the liquid treating chambers 3600 may be provided to be stacked on each other. The liquid treating chambers 3600 are disposed at one side of the transfer chamber 3402. The liquid treating chambers 3600 are arranged side by side in the first direction 12. Some of the liquid treating chambers 3600 are provided adjacent to the index module 20. Hereinafter, the liquid treating chambers will be referred to as a front liquid treating chamber 3602. Other portions of the liquid treating chambers 3600 are provided adjacent to the interface module 40. Hereinafter, the liquid treating chambers are referred to as rear heat treating chambers 3604 (rear heat treating chambers).

The front stage liquid treating chamber 3602 applies a first liquid on the substrate W, and the rear stage liquid treating chamber 3604 applies a second liquid on the substrate W. The first liquid and the second liquids may be different types of liquid. According to an embodiment, the first liquid is an anti-reflection film, and the second liquid is photoresist. The photoresist may be applied on the substrate W on which the anti-reflection film is applied. Optionally, the first liquid may be photoresist, and the second liquid may be an anti-reflection film. In this case, the anti-reflection film may be applied on the photoresist-applied substrate W. Optionally, the first liquid and the second liquid are the same type of liquid, and both the first liquid and the second liquid may both be photoresist.

The buffer chamber 3800 is provided in plurality. Some of the buffer chambers 3800 are disposed between the index module 20 and the transfer chamber 3400. Hereinafter, the buffer chambers are referred to as a front buffer 3802. The front buffers 3802 are provided in plurality and are disposed to be stacked on each other in the vertical direction. Another portion of the buffer chambers 3802 and 3804 is disposed between the transfer chamber 3400 and the interface module 40. Hereinafter, the buffer chambers are referred to as a rear buffer 3804. The rear buffers 3804 are provided in plurality and are disposed to be stacked on each other in the vertical direction. Each of the front buffers 3802 and the rear buffers 3804 temporarily stores a plurality of substrates W. The substrate W stored in the front buffer 3802 is loaded or unloaded by the index robot 2200 and the transfer robot 3422. The substrate W stored in the rear buffer 3804 is loaded or unloaded by the transfer robot 3422 and the first robot 4602.

The developing block 30b includes a heat treating chamber 3200, a transfer chamber 3400, and a liquid treating chamber 3600. The heat treating chamber 3200, the transfer chamber 3400, and the liquid treating chamber 3600 of the developing block 30b have structures and arrangement substantially similar to those of the heat treating chamber 3200, the transfer chamber 3400, and the liquid treating chamber 3600 of the coating block 30a, and thus, descriptions thereof will be omitted. However, in the developing block 30b, a developing liquid is equally supplied to all of the liquid treating chambers 3600 and provided to the developing chamber 3600, in which the substrate is developed.

The interface module 40 connects the treating module 30 to an external exposure device 50. The interface module 40 includes an interface frame 4100, an additional process chamber 4200, an interface buffer 4400, and a transfer member 4600.

A fan filter unit for forming downdraft therein may be provided on an upper end of the interface frame 4100. The additional process chamber 4200, the interface buffer 4400, and the transfer member 4600 are disposed inside the interface frame 4100. The additional process chamber 4200 may perform a predetermined additional process before the substrate W, which has been treated in the coating block 30a, is loaded into the exposure device 50. Optionally, the additional process chamber 4200 may perform a predetermined additional process before the substrate W, which has been treated in the exposure apparatus 50, is loaded into the developing block 30b. According to an embodiment, the additional process may be an edge exposure process of exposing an edge area of the substrate W, a top surface cleaning process of cleaning the top surface of the substrate W, or a bottom surface cleaning process of cleaning the bottom surface of the substrate W. The additional process chamber 4200 may be provided in plurality and may be provided to be stacked on each other. All of the additional process chambers 4200 may be provided to perform the same process. Optionally, some of the additional process chambers 4200 may be provided to perform different processes.

The interface buffer 4400 provides a space in which the substrate W transferred between the coating block 30a, the additional process chamber 4200, the exposure device 50, and the developing block 30b temporarily stays during the transfer. The interface buffer 4400 may be provided in plurality, and the plurality of interface buffers 4400 may be provided to be stacked on each other.

According to an embodiment, the additional process chamber 4200 may be disposed on one surface of the transfer chamber 3400 with respect to an extension line in a longitudinal direction of the transfer chamber 3400, and the interface buffer 4400 may be disposed on the other surface of the transfer chamber 3400.

The transfer member 4600 transfers the substrate W between the coating block 30a, the addition process chamber 4200, the exposure apparatus 50, and the developing block 30b. The transfer member 4600 may be provided as one or a plurality of robots. According to an embodiment, the transfer member 4600 includes a first robot 4602 and a second robot 4606. The first robot 4602 is provided to transfer the substrate W between the coating block 30a, the additional process chamber 4200, and the interface buffer 4400, the interface robot 4606 is provided to transfer the substrate W between the interface buffer 4400 and the exposure device 50, and the second robot 4604 may be provided to transfer the substrate W between the interface buffer 4400 and the developing block 30b.

Each of the first robot 4602 and the second robot 4606 may include a hand on which the substrate W is placed, and the hand may be provided to move forward and backward, rotate about an axis parallel to the third direction 16, and to be movable along three directions 16.

All the hands of the index robot 2200, the first robot 4602, and the second robot 4606 may have the same shape as the hands 3420 of the transport robots 3422 and 3424. Optionally, the hand of the robot directly loading/unloading the substrate W into/from the transfer plate 3240 of the heat treating chamber is provided in the same shape as the hand 3420 of the transfer robots 3422 and 3424, and the hands of the remaining robots have different shapes.

According to an embodiment, the index robot 2200 is provided to directly load/unload the substrate W into/from the heating unit 4000 of the front heat treating chamber 3200 provided in the coating block 30a.

In addition, the transfer robot 3422 provided in the coating block 30a and the developing block 30b may be provided to directly load/unload the substrate W into/from the transfer plate 3240 disposed in the heat treating chamber 3200.

In the above-described example, the gas block 4530 is provided and processed as a single body as an example, but is not limited thereto. For example, the gas block 4530 may be constituted by a first body defining the supply space 4531 and a second body combined with the first body to define the exhaust space 4533.

According to an embodiment of the inventive concept, the film applied on the substrate may be uniformly controlled.

In addition, according to an embodiment of the inventive concept, the gas may be uniformly supplied onto the substrate during the heating process.

In addition, according to an embodiment of the inventive concept, the gas supplied onto the substrate may be uniformly exhausted during the heating process.

In addition, according to an embodiment of the inventive concept, the increase in area occupied by the heating unit performing the heating process on the substrate may be minimized.

It will be understood that the effects of the prevent invention are not limited to the above-described effects and include all effects that are deducible from the inventions disclosed in the detailed description or claims of the present invention.

The above detailed description exemplifies the present invention. Further, the above contents just illustrate and describe preferred embodiments of the present invention and the present invention can be used under various combinations, changes, and environments. That is, it will be appreciated by those skilled in the art that substitutions, modifications and changes may be made in these embodiments without departing from the principles and spirit of the general inventive concept, the scope of which is defined in the appended claims and their equivalents. The above-mentioned embodiments are used to describe a best mode in implementing the present invention. The present invention can be implemented in a mode other than a mode known to the art by using another invention and various modifications required a detailed application field and usage of the present invention can be made. Therefore, the detailed description of the present invention does not intend to limit the present invention to the disclosed embodiments. Further, the appended claims should be appreciated as a step including even another embodiment.

What is claimed is:

1. An apparatus for treating a substrate, comprising:
a chamber having an inner space;
a support configured to support the substrate in the inner space;
a gas supply tube configured to supply a gas onto the substrate supported on the support;
a gas exhaust tube configured to exhaust the gas from the inner space; and
a gas block connected to the gas supply tube and the gas exhaust tube and provided above the chamber, the gas supply tube is connected to a side portion of the gas block,
wherein the gas block includes:
a supply space configured to provide a supply path for the gas supplied from the gas supply tube;
an exhaust space configured to provide an exhaust path for the gas exhausted by the gas exhaust tube; and
an exhaust channel configured to connect a first region and a second region,
wherein each of the first region and second region is a partial region of the exhaust space and that the first region is closer to the gas exhaust tube than the second region,
the exhaust channel vertically overlaps an uppermost portion of the supply space, and
the uppermost portion of the supply space is vertically between the exhaust channel and the chamber.

2. The apparatus of claim 1, wherein the gas block is disposed so that the supply space overlaps a central region of the inner space when viewed from above.

3. The apparatus of claim 2, wherein the exhaust space is defined to surround the supply space when viewed from above.

4. The apparatus of claim 1, wherein the gas exhaust tube is connected to the side portion of the gas block.

5. The apparatus of claim 1, wherein the exhaust channel is provided so that at least a portion of the exhaust channel overlaps the supply space when viewed from above.

6. The apparatus of claim 5, wherein an upper end of the exhaust space is defined higher than an upper end of the supply space.

7. The apparatus of claim 1, wherein the exhaust channel comprises:
a first exhaust channel; and
a second exhaust channel provided to cross the first exhaust channel when viewed from above.

8. The apparatus of claim 7, wherein, when viewed from above, a crossing angle between the first exhaust channel and the second exhaust channel ranges of about 70 degrees to about 110 degrees.

9. An apparatus for treating a substrate, comprising:
a chamber having an inner space;
a support configured to support the substrate in the inner space and adjust a temperature of the substrate; and
a gas assembly configured to supply a gas into the inner space or exhaust the gas from the inner space,
wherein the gas assembly comprises:
a gas block provided above the chamber and having a supply space configured to provide a supply path for the gas, and an exhaust space configured to provide an exhaust path for the gas, an exhaust channel configured to connect a first region and a second region;
a gas supply tube connected to the supply space and to a side portion of
the gas block; and
a gas exhaust tube connected to the exhaust space,
wherein each of the first region and second region is a partial region of the exhaust space and that the first region is closer to the gas exhaust tube than the second region,
the exhaust channel vertically overlaps an uppermost portion of the supply space, and
the uppermost portion of the supply space is vertically between the exhaust channel and the chamber.

10. The apparatus of claim 9, wherein the gas exhaust tube is connected to the side portion of the gas block.

11. The apparatus of claim 9, wherein the supply space is defined in a central region of the gas block when viewed from above, and
the exhaust space is defined in an edge region of the gas block to surround the supply space.

12. The apparatus of claim 11, wherein the exhaust space comprises the first region and the second region that is a region farther from a position, at which the gas exhaust tube is connected to the exhaust space, than the first region, and the gas block has the exhaust channel through which the first region is in fluid communication with the second region.

13. The apparatus of claim 12, wherein the exhaust channel comprises:
   a first exhaust channel; and
   a second exhaust channel provided to cross the first exhaust channel when viewed from above.

14. The apparatus of claim 13, wherein a crossing point between the first exhaust channel and the second exhaust channel is disposed on a virtual straight line extending from the gas exhaust tube, and
   a crossing angle between the first exhaust channel and the second exhaust channel ranges of about 70 degrees to about 110 degrees.

15. The apparatus of claim 11, wherein the exhaust channel is provided so that at least a portion of the exhaust channel overlaps the supply space when viewed from above, and
   the exhaust channel is provided above the supply space when viewed from the front.

16. The apparatus of claim 9, wherein the chamber comprises:
   a housing having an opened upper portion;
   a cover disposed above the housing and combined with the housing to define the inner space; and
   a gap block configured to define a gap between the housing and the cover.

17. The apparatus of claim 9, wherein the chamber comprises:
   a housing having an opened upper portion; and
   a cover disposed above the housing, combined with the housing to define the inner space, and provided with an exhaust path that is in fluid communication with the exhaust space,
   wherein the gas assembly comprises a baffle installed in the cover and disposed to face the gas supplied from the supply space.

18. An apparatus for treating a substrate, comprising:
a chamber having an inner space;
a support configured to support the substrate in the inner space and heat the substrate; and
a gas assembly configured to supply a gas into the inner space or exhaust the gas from the inner space,
wherein the chamber comprises:
   a housing having an opened upper portion; and
   a cover disposed above the housing to define an exhaust path, wherein the gas assembly comprises:
   a gas block provided above the chamber and defining-having a supply space configured to provide a supply path for the gas and an exhaust space configured to provide an exhaust path for the gas;
   a gas supply tube connected to the supply space and to a side portion of the gas block;
   a gas exhaust tube connected to the exhaust space; and
   a baffle installed in the cover and disposed to face the gas supplied from the supply space,
wherein the exhaust space comprises a first region and a second region that is a region farther from a position, at which the gas exhaust tube is connected to the exhaust space, than the first region,
wherein an exhaust channel configured to allow the first region and the second region to be in fluid communication with each other is provided in the gas block, and
the exhaust channel vertically overlaps an uppermost portion of the supply space, and
the uppermost portion of the supply space is vertically between the exhaust channel and the chamber,
   wherein the exhaust channel comprises:
   a first exhaust channel; and
   a second exhaust channel configured to cross the first exhaust channel when viewed from above.

* * * * *